United States Patent

Kuo et al.

[11] Patent Number: 6,063,709
[45] Date of Patent: *May 16, 2000

[54] REMOVAL OF SOG ETCHBACK RESIDUE BY ARGON TREATMENT

[75] Inventors: Kang-Min Kuo, Hsin-chu; Wen-Hsiang Tang; Su-Ying Su, both of Taipei; Chi-Ming Wu, Hsinchu, all of Taiwan

[73] Assignee: Taiwan Semiconductor Manufacturing Company, Hsin-Chu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 09/149,259

[22] Filed: Sep. 8, 1998

[51] Int. Cl.$^7$ .................................................. H01L 21/308
[52] U.S. Cl. ......................... 438/710; 438/711; 438/712; 438/719; 438/720; 438/725
[58] Field of Search .................................... 438/706, 712, 438/699, 710, 711, 720, 719, 723, 725; 156/345; 430/310

[56] References Cited

U.S. PATENT DOCUMENTS

| | | | |
|---|---|---|---|
| 5,472,825 | 12/1995 | Sayka | 430/311 |
| 5,631,197 | 5/1997 | Yu et al. | 438/699 |
| 5,639,345 | 6/1997 | Huang et al. | 156/657.1 |
| 5,679,211 | 10/1997 | Huang | 156/643.1 |
| 5,702,970 | 12/1997 | Choi | 438/3 |
| 5,786,259 | 7/1998 | Kang | 438/396 |

*Primary Examiner*—Benjamin L. Utech
*Assistant Examiner*—Binh X. Tran
*Attorney, Agent, or Firm*—George O. Saile; Stephen B. Ackerman

[57] ABSTRACT

A process for etching back SOG during planarization is described. A mix of $CHF_3$ and $CF_4$ in an argon carrier gas is used, with the latter having a flow rate of about 175 SCCM. An RF discharge is initiated for about 10 seconds during which time etching occurs. The system is then cleared of all reactive gases by a brief pumpdown to base pressure. In a key feature of the invention, argon alone is now admitted to the reaction chamber at a greater than normal flow rate of about 273 SCCM. This high flow rate is maintained for about 40 seconds (including about 10 seconds to reach an equilibrium pressure of about 225 mtorr) following which the system is pumped out again and the process is terminated. If this procedure is followed, no polymeric residue is generated at the surface of any exposed titanium nitride.

15 Claims, 2 Drawing Sheets

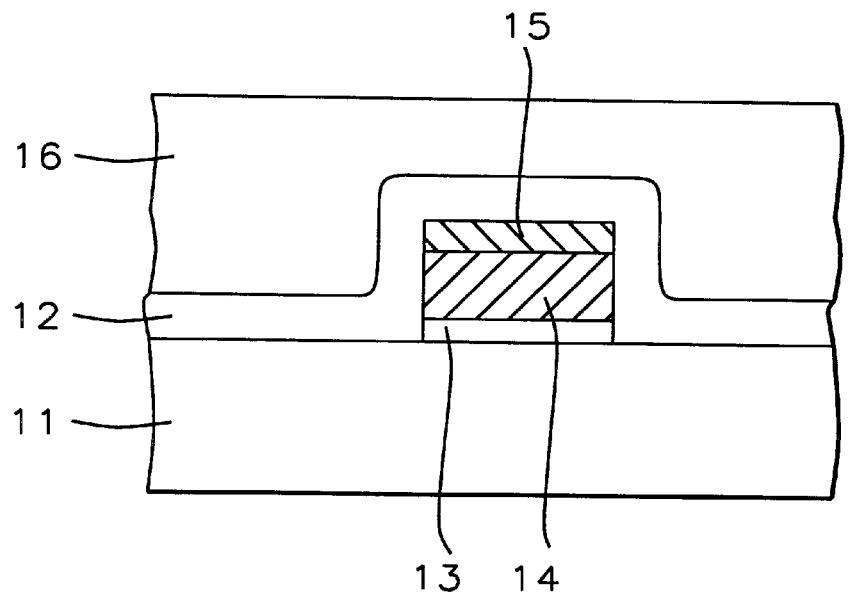
*FIG. 1 - Prior Art*
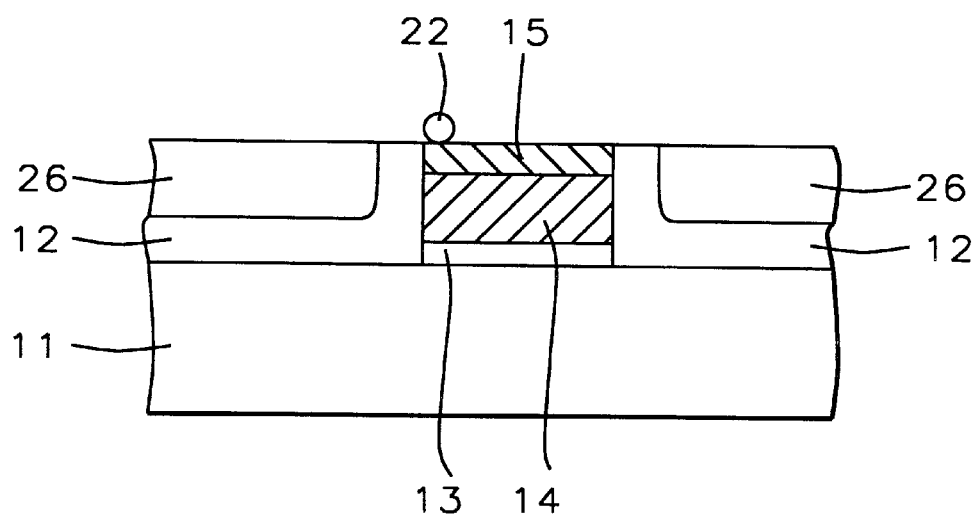
*FIG. 2 - Prior Art*

6,063,709

REMOVAL OF SOG ETCHBACK RESIDUE BY ARGON TREATMENT

FIELD OF THE INVENTION

The invention relates to the general field of integrated circuit processing with particular reference to etching back a layer of spin on glass.

BACKGROUND OF THE INVENTION

In the course of manufacturing an integrated circuit, it becomes necessary to planarize the surface. For example, as shown in FIG. 1, a line of metal 14 has been etched from a continuous layer and sits atop substrate 11, with intermediate glue layer 13. Prior to application of the photoresist used to define the shape of line 14, an anti-reflection coating (ARC) 15 of titanium nitride was applied to the metal surface. After etching, the titanium nitride remained in place. This was followed by the deposition of a conformal layer 12 of oxide for the purpose of keeping the SOG from touching the metal. In order to planarize the surface, a layer of spin on glass (SOG) 16 was then applied.

To guarantee that all projections are covered, layer 16 is necessarily too thick and must be etched back until the highest projection is just exposed. In this example, this would be the top surface of titanium nitride layer 15, giving the structure the appearance shown in FIG. 2 where layer 26 represents the original SOG layer 16 after etchback. It has been found that as a byproduct of this etchback process a polymeric residue is formed. The exact composition of this residue is not known but it has been found to include both titanium and fluorine. This residue is most commonly seen in the form of particulate contamination such as particle 22.

Traditional methods for removing this source of contamination, such as the application of RF (radio frequency), have proven to be unsuccessful. The present invention provides a simple, but effective, method for preventing the formation of the polymeric residue.

In the course of searching for prior art, no invention teaching the precise method of the present invention was found. Several references were, however, found to be of interest. For example, in U.S. Pat. No. 5,472,825, Sayka shows an argon plasma treatment of a SOG layer after an etchback to densify the SOG layer. In U.S. Pat. No. 5,679,211, Huang shows a method of etching back SOG using an oxygen-containing gas plasma treatment (e.g. Ar/O$_2$) that removes SOG residues. In U.S. Pat. No. 5,639,345, Huang et al. show a method for a two step etch back of an oxide and SOG layer, while in U.S. Pat. No. 5,631,197 Yu et al. also show a SOG etch back process.

SUMMARY OF THE INVENTION

It has been an object of the present invention to provide a process for SOG etchback during planarization.

Another object of invention has been that no particulate contamination by a polymeric residue take place during said process even though titanium nitride gets exposed during etchback.

A further object has been that said process be compatible with existing methods for achieving SOG etchback.

These objects have been achieved by using a mix of CHF$_3$ and CF$_4$ in an argon carrier gas with the latter having a flow rate of about 175 SCCM. An RF discharge is initiated for about 10 seconds during which time etching occurs. The system is then cleared of all reactive gases by a brief pumpdown to base pressure. In a key feature of the invention, argon alone is now admitted to the reaction chamber at a greater than normal flow rate of about 273 SCCM. This high flow rate is maintained for about 40 seconds (including about 10 seconds to reach an equilibrium pressure of about 225 mtorr) following which the system is pumped out again and the process is terminated. If this procedure is followed, no polymeric residue is generated at the surface of any exposed titanium nitride.

BRIEF DESCRIPTION OF THE DRAWINGS

FIG. 1 is a cross-section through a multi-layer structure that has been planarized with a layer of SOG.

FIG. 2 shows the structure of FIG. 1 after etchback and illustrates how particulate contamination can occur on the surface of a freshly exposed layer of titanium nitride.

DESCRIPTION OF THE PREFERRED EMBODIMENTS

Figure 3:
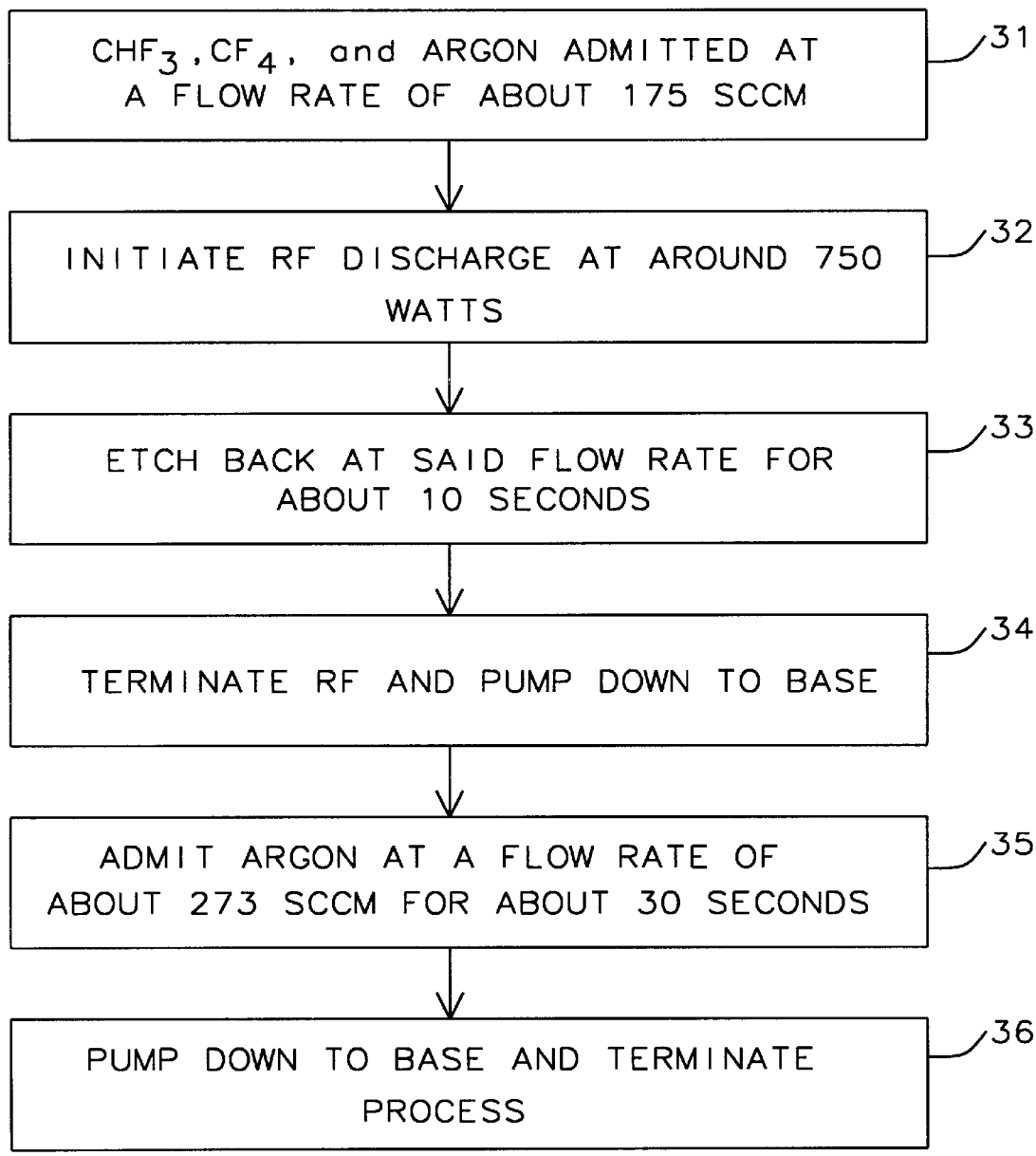
FIG. 3 shows the principal steps of the process of the present invention summarized in flow chart form.

The process of the present invention assumes the presence of a multilayer structure, that includes a layer of titanium nitride, and that has been covered with a layer of SOG for purposes of planarization. It is further assumed that in the course of etching back the SOG some amount of the titanium nitride will b e exposed. Etching is assumed to be performed using reactive ions (RIE) in an RF discharge of the electrodeless variety. The process of the present invention comprises six principal steps which are summarized in flow chart form in FIG. 3.

Referring now to box 31 in FIG. 3, a mixture of trifluoro methane (CHF$_3$), carbon tetrafluoride (CF$_4$), and an inert gas such as argon is admitted into the gas containment system (reaction chamber). The flow rates for these various gases are adjusted as follows: for the CHF$_3$ between about 30 and 100 SCCM (standard cc per minute), with 66 SCCM being preferred, for the CF$_4$ between about 10 and 50 SCCM, with 32 SCCM being preferred, and for the argon between about 50 and 300 SCCM, with 175 SCCM being preferred. The combined flow rate for all three gases is between about 100 and 500 SCCM. This is set to run for between about 1 and 30 seconds with about 10 seconds being preferred. This is sufficient time for the system to stabilize and reach an equilibrium pressure between about 100 and 500 mtorr, with about 225 mtorr being preferred.

With equilibrium established, we proceed to box 32. The RF discharge is initiated thereby causing etching of the SOG to begin. The applied RF power is at a power level between about 500 and 1,000 watts, with about 750 wafts being preferred, and it is applied for between about 10 and 100 seconds, with about 70 seconds being preferred. This results in an etch rate of the SOG between about 1,000 and 5,000 Angstroms per minute.

Once the RF has been terminated (box 34), all gas flow into the system is terminated and the system is allowed to pump down to its base (equilibrium) value of about 1 mtorr. This pumping step is set to last for between about 5 and 30 seconds with about 10 seconds being preferred.

A key feature of the invention is now introduced as shown in box 35 of FIG. 3. An inert gas (usually argon but other gases such as helium, neon, and nitrogen) would also work) is admitted to the system at a flow rate of between about 100 and 500 SCCM with about 273 SCCM being preferred. After a stabilization period lasting between about 5 and 30 seconds with about 10 seconds being preferred, an equilibrium pressure between about 100 and 500 mtorr, with about 225 mtorr being preferred, is established. The flow of the argon at said rate is now allowed to continue for between about 10 and 120 seconds with about 30 seconds being preferred.

The process of the present invention then concludes with shutting off the supply of argon and once more allowing the system to be pumped to its base value. This takes between about 1 and 60 seconds with about 10 seconds being typical.

We have summarized the process of the present invention in table I below showing the preferred values for the various variables.

TABLE I

Summary of the process

| step | RF power watts | pressure mtorr | etchant gas1 | flow rate* | gas2 | flow rate* | argon flow rate* | time secs. |
|---|---|---|---|---|---|---|---|---|
| 1. Stabilize | 0 | 225 | CHF$_3$ | 66 | CF$_4$ | 32 | 175 | 10 |
| 2. Main etch | 750 | 225 | CHF$_3$ | 66 | CF$_4$ | 32 | 175 | 10 |
| 3. Pump | 0 | base | — | | — | | 0 | 10 |
| 4. Stabilize | 0 | 225 | — | | — | | 273 | 10 |
| 5. Cleanup | 0 | 225 | — | | — | | 273 | 30 |
| 6. Pump | 0 | base | — | | — | | 0 | 10 |

*SCCM

While the invention has been particularly shown and described with reference to the preferred embodiments thereof, it will be understood by those skilled in the art that various changes in form and details may be made without departing from the spirit and scope of the invention.

What is claimed is:

1. A process for removing a polymeric residue formed through exposure of a layer of titanium nitride during SOG etch back, comprising:

providing a plurality of layers including a layer of titanium nitride, covered by layer of SOG;

placing the layers in a gas containment system;

in an RF discharge, etching the SOG layer until said layer of titanium nitride has been exposed;

then admitting an inert gas alone for a first time period at a flow rate between about 100 and 500 SCCM whereby an equilibrium pressure between about 100 and 500 mtorr is established;

allowing the inert gas to flow at said flow rate and at said equilibrium pressure for a second time period; and then pumping the system down to base pressure.

2. The process of claim 1 wherein said first time period is between about 5 and 30 seconds.

3. The process of claim 1 wherein said second time period is between about 10 and 120 seconds.

4. The process of claim 1 wherein the inert gas is selected from the group consisting of argon, helium, neon, and nitrogen.

5. The process of claim 1 wherein etching the SOG further comprises the use of reactive ion etching.

6. The process of claim 1 wherein said base pressure is a pressure less than about 0.5 torr.

7. The process of claim 1 wherein said plurality of layers is part of an integrated circuit.

8. A process for etching back SOG in an integrated circuit, during a planarization process that includes uncovering a layer of titanium nitride, comprising:

placing the integrated circuit within a gas containment system;

admitting trifluoro methane into the system at flow rate between about 30 and 100 SCCM, carbon tetra fluoride at a flow rate between about 10 and 50 SCCM, and argon at a flow rate between about 100 and 300 SCCM, to give a total gas flow rate that is between about 100 and 500 SCCM, for a first time period during which an equilibrium pressure between about 100 and 500 mtorr is established;

while maintaining said flow rates and pressure for a second time period, initiating an RF discharge in the gas at a power level;

after terminating said RF discharge, stopping all gas flow and allowing the system to be pumped for a third period, thereby attaining base pressure;

then admitting argon alone into the system at a flow rate between about 100 and 500 SCCM for a fourth time period, during which an equilibrium pressure between about 100 and 500 mtorr is established;

maintaining a flow rate between about 100 and 500 SCCM of argon for a fifth time period;

and then stopping all gas flow and allowing the system to be pumped down to base pressure.

9. The process of claim 8 wherein said first time period is between about 5 and 30 seconds.

10. The process of claim 8 wherein said second time period is between about 10 and 120 seconds.

11. The process of claim 8 wherein said third time period is between about 5 and 30 seconds.

12. The process of claim 8 wherein said fourth time period is between about 10 and 120 seconds.

13. The process of claim 8 wherein said fifth time period is between about 1 and 60 seconds.

14. The process of claim 8 wherein said RF power level is between about 500 and 1,000 watts.

15. The process of claim 8 wherein said RF discharge is an electrodeless discharge.

* * * * *